US008901705B2

United States Patent
Roest et al.

(10) Patent No.: US 8,901,705 B2
(45) Date of Patent: Dec. 2, 2014

(54) 3D INTEGRATION OF A MIM CAPACITOR AND A RESISTOR

(75) Inventors: Aarnoud Laurens Roest, Geldrop (NL); Mareike Klee, Straelen (DE); Rudiger Gunter Mauczok, Erkelenz (DE); Linda Van Leuken-Peters, Maarheeze (NL); Robertus Adrianus Maria Wolters, Eindhoven (NL)

(73) Assignee: NXP, B.V., Eindhoven (NL)

( * ) Notice: Subject to any disclaimer, the term of this patent is extended or adjusted under 35 U.S.C. 154(b) by 232 days.

(21) Appl. No.: 13/126,233

(22) PCT Filed: Oct. 22, 2009

(86) PCT No.: PCT/IB2009/054678
§ 371 (c)(1),
(2), (4) Date: Apr. 27, 2011

(87) PCT Pub. No.: WO2010/049859
PCT Pub. Date: May 6, 2010

(65) Prior Publication Data
US 2011/0204480 A1  Aug. 25, 2011

(30) Foreign Application Priority Data
Oct. 28, 2008 (EP) .................................... 08167765

(51) Int. Cl.
*H01L 27/06* (2006.01)
*H01L 49/02* (2006.01)
*H01L 23/522* (2006.01)

(52) U.S. Cl.
CPC ............ *H01L 28/55* (2013.01); *H01L 23/5223* (2013.01); *H01L 23/5228* (2013.01); *H01L 28/20* (2013.01); *H01L 27/0688* (2013.01)

USPC .................. 257/532; 257/536; 257/E27.026; 257/E21.004; 257/E21.008; 438/382; 438/396

(58) Field of Classification Search
None
See application file for complete search history.

(56) References Cited

U.S. PATENT DOCUMENTS 6,673,672 B2 *  1/2004  Sashida ......................... 438/253
7,224,040 B2     5/2007  Koutsaroff et al.
(Continued)

FOREIGN PATENT DOCUMENTS

WO          01/88969 A2    11/2001
WO     2006/092756 A1      9/2006
(Continued)

OTHER PUBLICATIONS

International Search Report and Written Opinion for Application PCT/IB2009/054678 (Feb. 26, 2010).

*Primary Examiner* — Wensing Kuo

(57) ABSTRACT

The present invention relates to an electronic component, that comprises, on a substrate, at least one integrated MIM capacitor, (114) an electrically insulating first cover layer (120) which partly or fully covers the top capacitor electrode (118) and is made of a lead-containing dielectric material, and a top barrier layer (122) on the first cover layer. The top barrier layer serves for avoiding a reduction of lead atoms comprised by the first cover layer under exposure of the first cover layer to a reducing substance. An electrically insulating second cover layer (124) on the top barrier layer has a dielectric permittivity smaller than that of the first cover layer establishes a low parasitic capacitance of the cover-layer structure. The described cover-layer structure with the intermediate top barrier layer allows to fabricate a high-accuracy resistor layer (126.1) on top.

14 Claims, 2 Drawing Sheets

(56) References Cited

U.S. PATENT DOCUMENTS

| | | |
|---|---|---|
| 2002/0177326 A1 | 11/2002 | Klee et al. |
| 2003/0146463 A1 | 8/2003 | Klee et al. |
| 2004/0183091 A1* | 9/2004 | Hibino .......................... 257/104 |
| 2005/0205919 A1* | 9/2005 | Ozaki et al. ................... 257/306 |
| 2006/0231014 A1 | 10/2006 | Meyer et al. |
| 2008/0001292 A1 | 1/2008 | Zelner et al. |
| 2009/0321877 A1 | 12/2009 | Wang |

FOREIGN PATENT DOCUMENTS

| | | |
|---|---|---|
| WO | WO 2007086021 A1 * | 8/2007 |
| WO | 2008/028660 A2 | 3/2008 |
| WO | 2008/111188 A1 | 9/2008 |

* cited by examiner

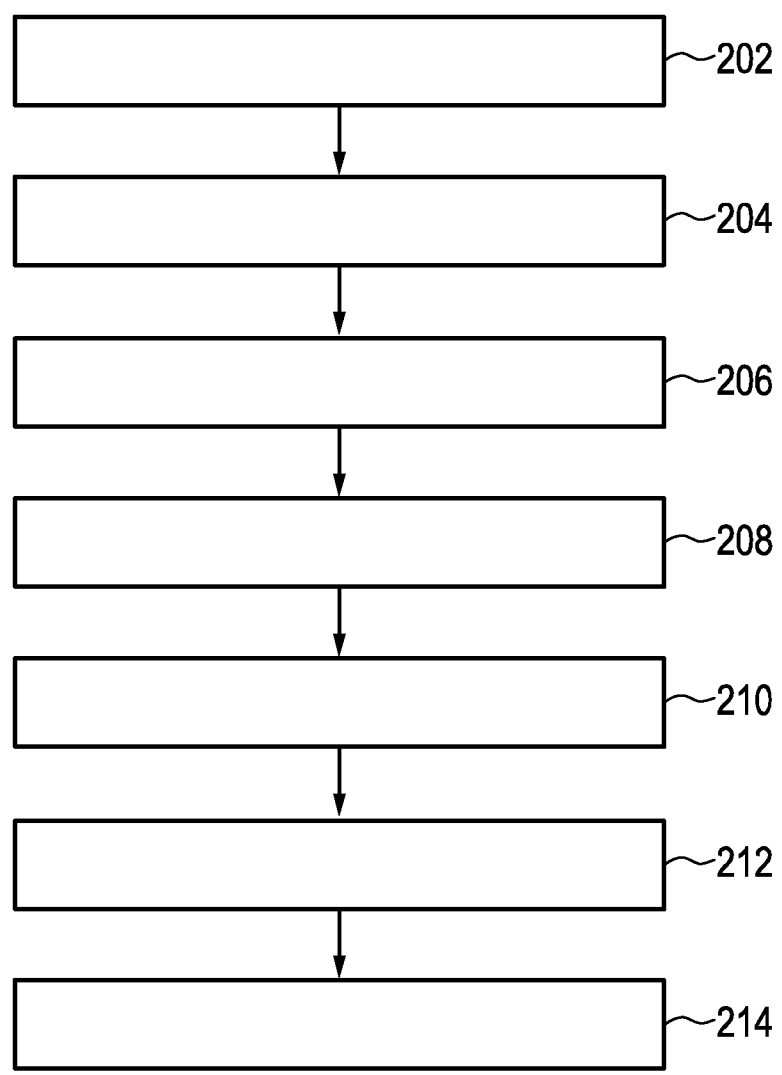

3D INTEGRATION OF A MIM CAPACITOR AND A RESISTOR

FIELD OF THE INVENTION

The present invention relates to an electronic component comprising at least one MIM capacitor, to an electronic device comprising the electronic component, and to methods for fabricating an electronic component and for fabricating an electronic device.

BACKGROUND OF THE INVENTION

MIM (metal-insulator-metal) capacitors based on high-K dielectrics play an important role for next generation Integrated Discretes (IDs) devices. Such Integrated Discretes devices comprise for instance capacitors, resistors and ESD protection diodes.

US 2008/0001292 A1 describes an electronic component with an integrated thin-film MIM capacitor structure on a substrate. The thin-film capacitor includes a pyrochlore or perovskite alkali earth dielectric layer between a plurality of electrode layers. A pyrochlore or perovskite hydrogen-gettering cover layer is deposited over the thin-film capacitor. It is in different embodiments made of $(Ba_xSr_y)TiO_3$ (BST), $BaTiO_3$, $CaTiO_3$, $SrTiO_3$, $BeTiO_3$, $MbTiO_3$ or a mix of these materials. The hydrogen-gettering cover layer prevents hydrogen from reacting with and degrading the properties of the dielectric material. A hermetic seal layer is then deposited over the cover layer by a hydrogen-producing method, without causing damage to the dielectric layer.

It is briefly mentioned in US 2008/0001292 A1 that other passive components such as inductors, resistors and capacitors can be integrated into the electronic component on the same substrate.

For saving chip area, it would be desirable to provide an electronic component with a three-dimensional arrangement of capacitors on one hand and resistors and/or inductors on the other hand, and optionally with other active or passive circuit elements, i.e., stacked on top of each other.

It would also be desirable to be able to provide such a three-dimensional arrangement when using cover layers made of different materials than those known from US 2008/0001292 A1. In particular, using a cover layer made of lead zirconate titanate ($Pb_xZr_zTi_{1-z}O_3$, PZT) raises difficulties. Issues of process reliability have been observed when using such a dielectric layers as a cover layer in a stacked arrangement of passives comprising a capacitor and a resistor on top of the capacitor. The difficulties arise in particular in a desired precise control of the electrical resistance of a resistor layer during manufacture of the device.

SUMMARY OF THE INVENTION

According to a first aspect of the present invention, an electronic component comprises, on a substrate:

at least one integrated MIM capacitor having a top capacitor electrode, and a bottom capacitor electrode at a smaller distance from the substrate than the top capacitor electrode;

an electrically insulating first cover layer on the top capacitor electrode, which first cover layer partly or fully covers the top capacitor electrode and is made of a lead-containing dielectric material;

a top barrier layer on the first cover layer, which top barrier layer is suitable for avoiding a reduction of lead atoms comprised by the first cover layer under exposure of the first cover layer to a reducing substance;

an electrically insulating second cover layer on the top barrier layer, which second cover layer partly or fully covers the first cover layer and the top barrier layer and has a dielectric permittivity smaller than that of the first cover layer; and an electrically conductive resistor layer arranged on the second cover layer, which resistor layer is either connected or connectable to form a resistor of a defined ohmic resistance in an electronic circuit.

The electronic component of the first aspect of the present invention comprises a resistor layer on top of a capacitor. Using the structure of the electronic component of the first aspect of the invention, the resistor layer can be fabricated with high reliability. That means, the resistor layer can be fabricated to precisely assume a desired electrical resistance. By using the structure of the electronic component of the present invention, the electrical-resistance value of the resistor layer on top of the MIM capacitor is not anymore influenced in an uncontrollable manner, as has been observed for prior-art device structures.

The electronic component of the first aspect of the invention is improved in its reliability also in the sense in that it allows achieving a high accuracy of the electrical resistance for a large number of electronic components fabricated concurrently on a single wafer, and in different processing runs, thus improving the fabrication efficiency and lowering the overall processing cost of the electronic component.

The structure of the electronic component of the first aspect of the invention is based on the recognition that, by using the first barrier layer, the lead-containing first cover layer is effectively prevented from loosing lead to chemically reducing reactive processes, which would otherwise cause structural irregularities in the second cover layer, which in turn would negatively affect the fabrication of the resistor layer, leading to the reliability issues described in the context of the background art. On the other hand, even if a structure without either the first or the second cover layer could achieve a reliably deposited and highly accurate resistor layer, the structure of the electronic component would loose its advantages for many of its applications, which in particular involve the use of high-K MIM capacitors. In the following, embodiments of the electronic component of the first aspect of the invention will be described. It shall be understood that the additional features of respective embodiments can be combined to form additional embodiments, unless such embodiments are disclosed as mutually exclusive or as forming alternatives to each other.

While the application of the electronic component of the first aspect of the invention is not restricted to the field of electronic components with high-K MIM capacitors, they do form a preferred field of application for it. High-K MIM capacitors are very advantageous for operation under voltages even higher than 10 V. The structure of the electronic component of the first aspect of the invention allows improving the advantageous combination of high-K MIM capacitors with resistors in a stacked arrangement. The term high-K MIM capacitor as used herein refers to capacitors with a high-K capacitor dielectric between the top and bottom electrodes.

In preferred embodiments a relative dielectric constant of the capacitor dielectric between the top and bottom electrodes of the MIM capacitor is between 100 and 5000, which is controllable by the choice of dielectric material for the capacitor dielectric. MIM capacitors based on high-K materials can be used to obtain capacitance densities up to 100 $nF/mm^2$.

The relative dielectric constant as a material parameter is in the art synonymously also referred to as the relative static permittivity or, in short, as the dielectric constant, and often represented by the letter K or by $\in_r$.

One example of a suitable high-K capacitor dielectric is lead zirconate titanate, $PbZr_xTi_{1-x}O_3$ ($0 \leq x \leq 1$), also known as PZT. Materials having a dielectric constant in the range of 2000-5000, like for example PMNPT, i.e., $Pb(Mg_xNb_{1-x})O_3$—$PbTiO_3$, allow achieving even higher capacitance densities.

For embodiments having a lead-containing capacitor dielectric like the materials just mentioned, the lead-containing first cover layer provides a particular advantage in that the capacitor dielectric achieves a very high dielectric constant, which would in absence of the lead-containing first cover layer be negatively affected and thus be much lower. Using for instance lead-containing perovskite dielectrics, like PZT for both the capacitor dielectric and for the first cover layer allows achieving a capacitor dielectric with a dielectric constant of up to 1700. Also the breakdown voltage of the structure can be made particularly high, depending, of course, on the thickness of the capacitor dielectric.

The lead-containing first cover layer achieves this advantage of a high dielectric constant and a high breakdown voltage also for other lead-containing dielectric materials, such as PZT or PMNPT.

The lead-containing first cover layer, however, may also be used in absence of a lead-containing capacitor dielectric, and also in presence of a capacitor dielectric having a low dielectric constant, i.e., lower than 100.

In combination with the second cover layer that has a lower dielectric constant, preferably in range below 10, the close arrangement of the resistor layer and the top capacitor electrode can achieve a small parasitic capacitance value. The second cover layer is in preferred embodiments made of materials having a dielectric constant in the range of up to only 7, such as silicon nitride, silicon oxide, silicon oxynitride, or of one of these materials additionally containing hydrogen or organic residues. Of course, a combination of a plurality of the mentioned materials is also possible for the second cover layer. This may for instance take the form of a laminate structure of the second cover layer.

In this structure of first and second cover layers with the intermediate top barrier layer, the second cover layer is typically thicker than the first cover layer in order to achieve a desired low effective dielectric constant of the complete cover layer structure between the MIM capacitor and the resistor layer. The first cover layer may for instance have a thickness of between 10 and 300 nm.

The top barrier layer arranged between the first and second cover layers is in different embodiments made of aluminum oxide, barium titanate, strontium titanate, barium strontiun titanate, strontium zirconate, spin-on-glass (SOG), zirconium oxide or zirconium titanate or a combination of at least two of these materials. Like all these dielectric materials, any other suitable material should have the advantage of showing low leakage after the deposition of the second cover layer and at the same time having a low dielectric constant. A lower dielectric constant is preferred as long as the leakage is sufficiently low. The mentioned combination of materials in the top barrier layer may be achieved by a laminate structure or by a mixture of different materials.

A total thickness of the top barrier layer between 10 and 400 nanometer is used in typical embodiments. A preferred thickness range for the top barrier layer is the range between 20 and 200 nanometer.

In the case of a use of spin-on glass, a further advantageous embodiment provides both the top barrier layer and the second cover layer of this material. SOG is a low-k material that, if deposited thick enough, achieves the combination of the functions of the barrier layer and of the second cover layer alone. A processing advantage of this embodiment is that only one layer deposition is required in this embodiment for achieving the functions of both the top barrier layer and of the second cover layer.

A preferred embodiment that has a lead-containing high-K capacitor dielectric is also provided with a bottom barrier layer made of a dielectric material and arranged between the substrate and the bottom electrode. The bottom barrier layer, much like the first cover layer, serves to achieve a particularly high dielectric constant of the lead-containing capacitor dielectric, e.g., PZT, PLZT, or PMNPT.

The top and bottom capacitor electrodes are preferably, but not necessarily made of identical materials. A suitable material for both electrodes is platinum.

In an advantageous embodiment, the resistor layer either comprises or consists of an alloy of one or more elements of Mo, Ni, Cr, Ti, Si or W, or is made from a semiconducting material. In currently preferred embodiments, TiW or TiW (N) is used. On the resistor layer, an interconnect layer can be deposited directly, providing connectivity to the integrated circuitry that can be provided in the electronic component on the same substrate, or on another substrate to be connected by known means, such as flip-chip, system-in-package, etc. The interconnect layer can for instance be an aluminum layer. However, any other material known for use in interconnect structures can be used as an alternative.

The resistor can in some part of it be arranged in direct connection to the top electrode of the capacitor, while it is in other parts arranged on top of the second cover layer.

The resistor layer can be configured to form an inductor with an inductance of a desired value.

The electronic component of the first aspect of the invention or any of its embodiments disclosed herein are advantageously integrated with at least one active semiconductor element like a diode or a transistor in the same substrate, thus forming an electronic device with integrated active and passive circuit elements on the same substrate. A particularly high integration density can be obtained for such an electronic device, since the electronic component has the resistors are arranged on top of the MIM capacitors, thus allowing a saving of chip area.

An advantageous application case of the electronic component of the first aspect of the invention or any of its embodiments disclosed herein is an integrated ESD protection device, i.e., a device protecting electronic circuitry against electrostatic discharge. The ESD protection device additionally has at least one ESD protection diode arranged in the substrate, on which the electronic component is fabricated. The ESD protection device can be integrated with other electronic circuitry on the same substrate to form an integrated, ESD protected electronic device.

According to a second aspect of the invention, a method for fabricating an electronic component is provided, comprising:

fabricating, on a substrate, at least one integrated MIM capacitor having a top capacitor electrode, and a bottom capacitor electrode at a smaller distance from the substrate than the top capacitor electrode;

fabricating an electrically insulating first cover layer on the top capacitor electrode, which first cover layer partly or fully covers the top capacitor electrode and is made of a lead-containing dielectric material;

fabricating a first barrier layer on the first cover layer, which first barrier layer is suitable for avoiding a reduction of lead atoms comprised by the first cover layer under exposure of the first cover layer to a reducing substance;

fabricating an electrically insulating second cover layer on the barrier layer, which second cover layer partly or fully covers the first cover layer and the barrier layer and has a dielectric permittivity smaller than that of the first cover layer; and fabricating an electrically conductive resistor layer on the second cover layer, which resistor layer has a defined ohmic resistance.

The advantages of the method of the second aspect of the invention correspond to those achieved for the electronic component of the first aspect of the invention.

Embodiments of the method of the second aspect of the invention share their additional features with the embodiments of the electronic device of the first aspect disclosed herein.

Preferred embodiments of the electronic component of the first aspect of the invention and of the method of the second aspect of the invention are also disclosed by the claims.

DETAILED DESCRIPTION OF THE INVENTION

The present invention is further elucidated by the following figures and examples, which are not intended to limit the scope of the invention. A person skilled in the art will understand that various embodiments may be combined.

BRIEF DESCRIPTION OF THE DRAWINGS

In the drawings,

FIG. 2 shows a flow diagram of a process for fabricating the electronic component shown in FIG. 1.

DETAILED DESCRIPTION OF THE DRAWINGS

Figure 1:
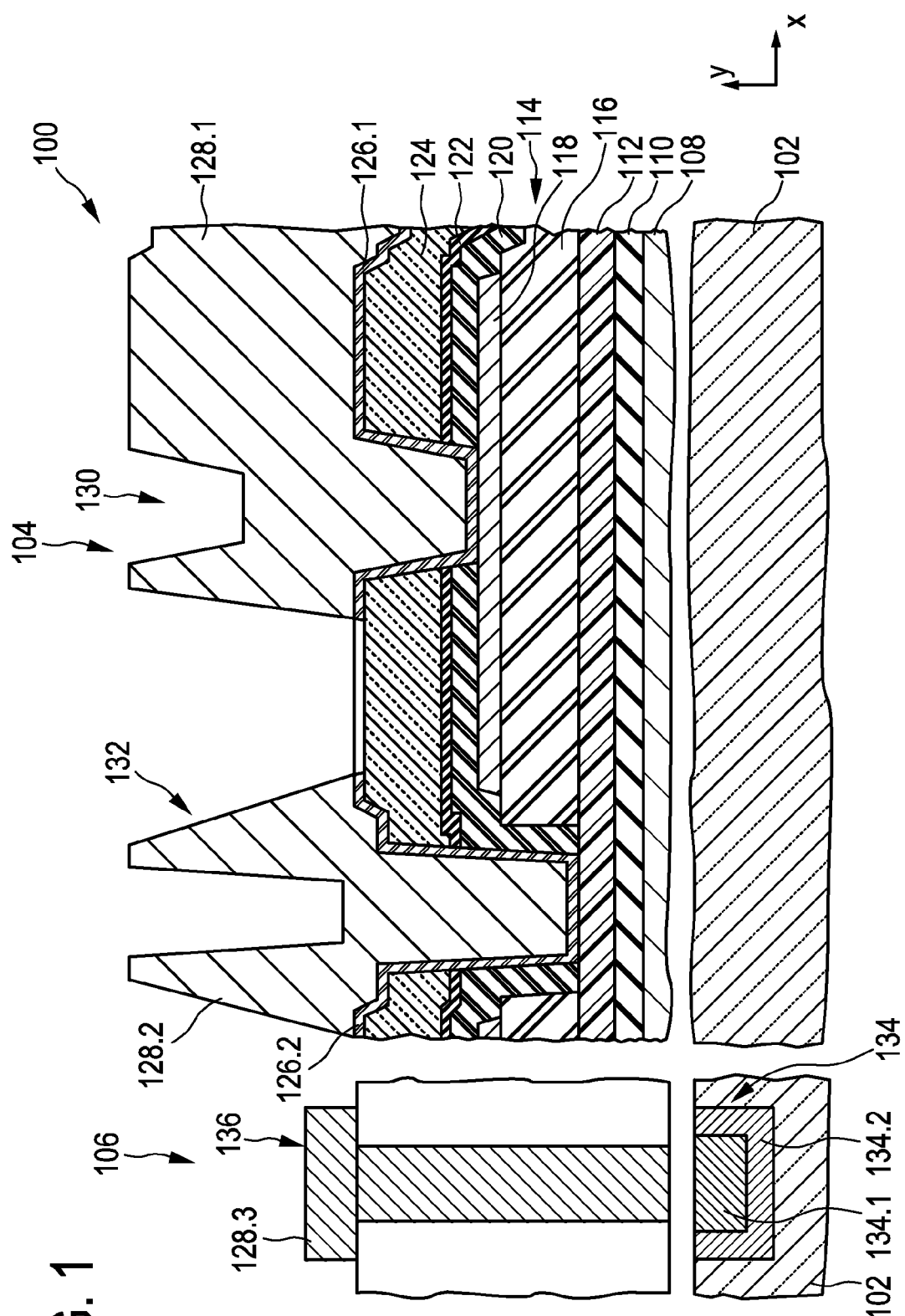
FIG. 1 shows a schematic cross-sectional view of an embodiment of an electronic device comprising an embodiment of an electronic component according to the present invention.

FIG. 1 shows a schematic cross-sectional view of an embodiment of an electronic device 100 on a substrate 102. Only selected portions of the electronic component are shown in order to focus the present description on parts of relevance for the present invention.

Only an upper section of the substrate 102 is shown. In this region, the substrate 102 is made of silicon, as used abundantly in the semiconductor industry. However, other substrate materials, such as GaAs, GaN, SiC or SiGe can be used here as an alternative, if suitable. Structured substrates such as silicon-on-insulator (SOI) may also be used according to the requirements of a particular application.

Passive and active circuit elements are integrated in the electronic device 100. A section of integrated passives is marked by a reference label 104 and forms an embodiment of an electronic component according to the present invention. A section of active components is shown under reference label 106. As is understood by a person of ordinary skill in the art, the graphical representation of the arrangement of the passive active and portions 104 and 106 is for illustrative purposes only and should not be understood as restricting the arrangement of active and passive circuit elements within the electronic device. For instance, active circuit elements like diodes and transistors may be provided in a region of the substrate 102, which is arranged underneath the passive circuit elements of the electronic component 104.

Graphical details corresponding to structural elements arranged in a vertical direction y between the substrate 102 and the electronic component 104 are omitted in FIG. 1 for reasons of simplicity of the present description. As mentioned, active or other passive circuit components may be arranged there, as suitable for a respective application case.

The shown structural detail of the electronic component 104 in the vertical direction y begins with a titanium oxide ($TiO_2$) layer 108, followed by a bottom barrier layer 110 made of a high-K dielectric material, such as PZT. On the bottom barrier layer 110, a bottom electrode 112 of a high-K MIM capacitors is deposited. A suitable electrode material is platinum. A capacitor dielectric 116 on the bottom electrode 112 has a smaller lateral extension than the bottom electrode in a lateral direction of the paper plane, indicated by x. The capacitor dielectric is in the present embodiment made of a high-K dielectric having a dielectric constant of more than 100. For achieving a particularly high capacitance density (capacity per area), PZT, PLZT or PMNPT are suitable dielectric materials. The thickness of the capacitor dielectric 116 is chosen according to the needs of a particular application. An example is 400 nm. However, lower or higher values can be chosen.

On top of the capacitor dielectric 116 a top electrode 118 of the MIM capacitor 114 is deposited. The top electrode is in the present embodiment made of the same material as the bottom electrode. The capacitor structure 114 is covered by a first cover layer 120 of a thickness that may be chosen between from the range between 90 and 300 nm.

The first cover layer 120 is made of a lead-containing material, in the present embodiment PZT. The first cover layer, like the bottom barrier layer 110, helps achieving a particularly high dielectric constant of the capacitor dielectric. For a PZT capacitor dielectric 116, a dielectric constant of up to 1700 achieved, so that with the mentioned exemplary thickness of the capacitor dielectric of 400 nm, a capacitance density of 30 $nF/mm^2$ can be achieved. At the same time, a breakdown voltage as high as 150 V is obtained.

If a resistor layer were hypothetically be deposited on this PZT first cover layer 118, a well-controlled and thus high-accuracy resistor could be achieved. But due to the high dielectric constant of the first cover layer, undesired large parasitic capacities would be created in the lateral range of the high-K MIM capacitor 114.

Therefore, a second cover layer 124 with a low dielectric constant is provided between the high-K first cover layer 120 and a resistor layer 126. However, 30 a formation of an extremely rough second cover layer results, according to experiments made by the inventors, if the second cover layer is deposited directly on the first cover layer. The roughness of the second cover layer in turn prevents the fabrication of a highly accurate resistor on top of the second cover layer.

The roughness seems to be caused by the fact that a fraction of the lead ions in the (in the case of PZT, PLZT, or PMNPT: perovskite) lattice of the first cover layer 118 are reduced under reducing processing conditions, in particular under hydrogen-rich deposition conditions that are normally used to deposit typical materials of the second cover layer, such as silicon nitride, silicon oxide, or silicon oxynitride. Hydrogen as an example of a reducing agent may not only affect outer regions of the first cover layer, but also penetrate into the first cover layer. Nuclei sites are observed to form under these conditions, which results in a nanowire growth the material of the second cover layer, probably via a VLS (vapor-liquid-solid) mechanism. This results in a rough surface of the second cover layer, which prevents the realization of high accuracy thin film resistors.

To achieve a high-accuracy resistor in the presence of the lead containing first cover layer 120 as well as of the low-k second cover layer 124, a top barrier layer 122 covers the first cover layer in the electronic component 104. The top barrier 15 layer serves to prevent a reduction of lead in the first cover layer 120 by exposure to reducing agents during fabrication and afterwards, for instance due to the presence of hydrogen in the deposition chamber during growth of subsequent layers. Hydrogen may also be present in these layers after the fabrication of the device is finished, thus leading to an accelerated degradation of the first cover layer in absence of a top barrier layer. Suitable materials of the top barrier layer 122 are for instance aluminum oxide, barium strontium titanate $Ba_xSr_{1-x}TiO_3$ (BST), barium titanate $BaTiO_3$, strontium titanate $SrTiO_3$, strontium zirconate, $SrZrO_3$, spin-on-glass (SOG), zirconium oxide, $ZrO_2$, or zirconium titatante $ZrTiO_4$. The dielectric constant of the above-mentioned materials is in the range between of 4 and 300. Aluminum oxide is in one embodiment provided in a non-stoichiometric form with less oxygen in comparison with stoichiometric $Al_2O_3$. This non-stoichiometric form which can be fabricated by Al sputtering in a reactive (oxidizing) environment.

Thus, the top barrier can also be designed to contribute as little as possible to an increase of the mentioned parasitic capacitance. The top barrier layer of the embodiment of FIG. 1 has a thickness chosen from the range between 20 and 200 nanometer.

Resistor layer 126 has different sections 126.1 and 126.2 forming individual resistors, and is in the present embodiment made of TiW, and may additionally contain nitrogen, i.e., be made of TiW(N). The resistor layer is deposited after patterning the cover-layer structure of the first cover layer 120 and the second cover layer 124, and the intermediate top barrier layer 122 allows forming the resistor layer also in contact openings of the cover-layer structure, establishing a direct contact between the bottom electrode 112 and the resistor 126.2, and between the top electrode 118 and the resistor 126.1.

On the resistor layer 126, an interconnect material such as Al(Cu) is grown and laterally patterned to form contacts or interconnects 130 and 132 to the top and bottom electrodes 118 and 112, respectively.

In the active section 106 of the electronic device, a diode 134 formed in the substrate is schematically indicated by doped substrate regions 134.1 and 134.2 of opposite conductivity type in the substrate. The diode is contacted via an interconnect 136.

The electronic device 100 can be applied in different fields. Particularly advantageous applications are in the field of radio frequency devices and ESD protection devices.

FIG. 2 shows a flow diagram of a method for fabricating the electronic component 104 of FIG. 1.

The electronic component is fabricated as follows:

A step 202 summarizes the fabrication of the integrated MIM capacitor 114 and the underlying layers 108 and 110, omitting for simplicity a description of the detailed processing of the layers 108 to 116, which as such were described in the context of FIG. 1.

Subsequently, the first cover layer 120 is fabricated on the top capacitor electrode 118 (step 204), followed by a deposition of the top barrier layer 122 (step 206). Then, the second cover layer 122 is deposited (step 208). Silicon nitride or silicon oxide or silicon oxynitride may for instance be deposited as the material of the second cover layer 122 using low-temperature plasma-enhanced chemical vapor deposition (LT PECVD), employing silane ($SiH_4$) as a silicon precursor and ammonia $NH_3$ or $N_2O$ as nitrogen precursors, and $O_2$ as oxygen source.

The cover-layer structure 120 to 124 may then patterned to form contact holes (step 210), and the resistor layer 126, shown as resistor layer segments 126.1 to 126.3, is deposited (step 212), optionally followed by a fabrication of an Al(Cu) layer to provide highly conductive contacts (step 214). It should be noted that the fabrication of a direct contact between the resistor layer 126.1 and the top capacitor electrode is an option, not a mandatory feature.

The method of the present embodiment allows forming the resistor layer 126 on a very smooth surface of the second cover layer 124, which in turn allows a very good control of the fabrication of the resistor layer. This way, a high accuracy of the resistor formed by the resistor layer is achieved.

The method of the present embodiment can be summarized in table form as follows:

Step 202 Fabrication of integrated MIM capacitor and underlying layers
Step 204 Fabrication of first cover layer
Step 206 Fabrication of top barrier layer
Step 208 Deposition of second cover layer
Step 210 Patterning cover-layer structure
Step 212 Fabrication of resistor layer
Step 214 Fabrication of contact structure While the invention has been illustrated and described in detail in the drawings and foregoing description, such illustration and description are to be considered illustrative or exemplary and not restrictive; the invention is not limited to the disclosed embodiments.

The terms "top" and "bottom", as used herein, only serve to differentiate different structural elements with respect to their distance from the substrate. A "bottom" structural element is closer to the substrate than a "top" structural element. The terms are not used to no imply an orientation in space of the electronic component or device.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

Any reference signs in the claims should not be construed as limiting the scope.

The invention claimed is:

1. An electronic component, comprising on a substrate:
    at least one integrated MIM capacitor having a top capacitor electrode, and a bottom capacitor electrode at a smaller distance from the substrate than the top capacitor electrode;
    an electrically insulating first cover layer on the top capacitor electrode, which first cover layer partly or fully covers the top capacitor electrode and is made of a lead-containing dielectric material;
    a top barrier layer on the first cover layer, which top barrier layer is suitable for avoiding a reduction of lead atoms comprised by the first cover layer under exposure of the first cover layer to a reducing substance;
    an electrically insulating second cover layer on the top barrier layer, which second cover layer partly or fully covers the first cover layer and the top barrier layer and has a dielectric permittivity smaller than that of the first cover layer; and
    an electrically conductive resistor layer arranged on the second cover layer, which resistor layer is either connected or connectable to form a resistor of a defined ohmic resistance in an electronic circuit, wherein the top barrier layer is made of barium titanate, strontium titanate, barium strontiun titanate, strontium zirconate, zirconium oxide or zirconium titanate or a combination of at least two of these materials, wherein the top barrier layer is in contacted with the first cover layer and with the second cover layer, and wherein the second cover layer is made of a material containing hydrogen.

2. The electronic component of claim 1, wherein the top barrier layer has a thickness of between 20 and 200 nm.

3. The electronic component of claim 1, wherein the MIM capacitor has a dielectric layer with a relative dielectric permittivity of between 100 and 5000.

4. The electronic component of claim 1, wherein the MIM capacitor has a dielectric layer made of lead zirconate titanate, i.e., PZT, or lanthanum-doped PZT, i.e., PLZT, or magnesium-doped lead niobate lead titanate, i.e., PMNPT, or a combination thereof.

5. The electronic component of claim 1, wherein the first cover layer is made of PZT.

6. The electronic component of claim 1, wherein the first cover layer has a thickness of between 90 and 300 nm.

7. The electronic component of claim 1, wherein either the lead-containing dielectric material or the material containing hydrogen includes silicon nitride, silicon oxide, or silicon oxynitride.

8. The electronic component of claim 3, comprising a bottom barrier layer made of a dielectric material between the substrate and the bottom electrode.

9. The electronic component of claim 1, wherein the resistor layer comprises an alloy of one or more elements of Mo, Ni, Cr, Ti, Si or W, or is made from a semiconducting material.

10. The electronic component of claim 1, wherein the resistor layer is directly connected with the top electrode.

11. An electronic device, comprising the electronic component of claim 1 and at least one active semiconductor element integrated on the same substrate.

12. An ESD protection device, comprising an electronic component according to claim 3 connected with at least one semiconductor diode in the substrate.

13. A method for fabricating an electronic component, comprising:
fabricating, on a substrate, at least one integrated MIM capacitor having a top capacitor electrode, and a bottom capacitor electrode at a smaller distance from the substrate than the top capacitor electrode;
fabricating an electrically insulating first cover layer on the top capacitor electrode, which first cover layer partly or fully covers the top capacitor electrode and is made of a lead-containing dielectric material;
fabricating a top barrier layer on the first cover layer, which top barrier layer is suitable for avoiding a reduction of lead atoms comprised by the first cover layer under exposure of the first cover layer to a reducing substance, wherein the top barrier layer is made of barium titanate, strontium titanate, barium strontiun titanate, strontium zirconate, zirconium oxide or zirconium titanate or a combination of at least two of these materials;
fabricating an electrically insulating second cover layer on the top barrier layer, which second cover layer partly or fully covers the first cover layer and the barrier layer and has a dielectric permittivity smaller than that of the first cover layer, wherein the top barrier layer is in contacted with the first cover layer and with the second cover layer, and wherein the second cover layer is made of a material containing hydrogen; and
fabricating an electrically conductive resistor layer on the second cover layer, which resistor layer has a defined ohmic resistance.

14. A method for fabricating an electronic device according to claim 11, comprising fabricating an electronic component according to the method of claim 13.

* * * * *